(12) United States Patent
Hoang et al.

(10) Patent No.: US 8,847,393 B2
(45) Date of Patent: Sep. 30, 2014

(54) VIAS BETWEEN CONDUCTIVE LAYERS TO IMPROVE RELIABILITY

(75) Inventors: Tuan S. Hoang, Austin, TX (US);
Puneet Sharma, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 14 days.

(21) Appl. No.: 13/036,461

(22) Filed: Feb. 28, 2011

(65) Prior Publication Data

US 2012/0217646 A1 Aug. 30, 2012

(51) Int. Cl.
*H01L 21/4763* (2006.01)
*H01L 23/48* (2006.01)
*H01L 23/52* (2006.01)
*H01L 29/40* (2006.01)
*H01L 23/528* (2006.01)
*H01L 23/522* (2006.01)

(52) U.S. Cl.
CPC .......... *H01L 23/528* (2013.01); *H01L 23/5226* (2013.01)
USPC .............. 257/750; 257/E23.145; 438/622

(58) Field of Classification Search
USPC .............. 257/750, E23.145; 438/622, 638
See application file for complete search history.

(56) References Cited

U.S. PATENT DOCUMENTS

| | | | |
|---|---|---|---|
| 5,849,637 A * | 12/1998 | Wang | 438/699 |
| 6,864,171 B1 * | 3/2005 | Hoinkis et al. | 438/638 |
| 7,157,365 B2 | 1/2007 | Ryan | |
| 7,272,814 B2 * | 9/2007 | Faber et al. | 716/119 |
| 7,439,173 B2 | 10/2008 | Greco et al. | |
| 7,750,480 B2 | 7/2010 | Kageyama | |
| 7,765,507 B2 | 7/2010 | Matsuoka | |
| 7,886,248 B2 * | 2/2011 | Hirota | 716/130 |
| 2004/0145033 A1 * | 7/2004 | McElvain | 257/659 |
| 2005/0035457 A1 | 2/2005 | Tomita et al. | |
| 2005/0248033 A1 | 11/2005 | Ryan | |
| 2007/0001309 A1 * | 1/2007 | Matsubara | 257/758 |
| 2007/0052068 A1 * | 3/2007 | Takemura et al. | 257/637 |
| 2007/0120261 A1 * | 5/2007 | Ho | 257/758 |
| 2007/0123009 A1 * | 5/2007 | Richter et al. | 438/479 |
| 2007/0262454 A1 * | 11/2007 | Shibata | 257/758 |
| 2008/0017989 A1 | 1/2008 | Lee et al. | |
| 2009/0039520 A1 * | 2/2009 | Tanaka et al. | 257/773 |
| 2009/0085120 A1 * | 4/2009 | Lu et al. | 257/368 |
| 2009/0230562 A1 | 9/2009 | Kondou et al. | |
| 2010/0044866 A1 | 2/2010 | Harada | |
| 2010/0242008 A1 * | 9/2010 | Liu et al. | 716/6 |
| 2010/0244264 A1 | 9/2010 | Kageyama | |
| 2010/0257502 A1 | 10/2010 | Matsuoka | |
| 2012/0318567 A1 * | 12/2012 | Park et al. | 174/257 |

OTHER PUBLICATIONS

Cadence, "Encounter Digital Implementation System User Guide", Product Version 9.1.3, Oct. 2010, pp. 898-902.

* cited by examiner

*Primary Examiner* — Matthew Landau
*Assistant Examiner* — Igwe U Anya
(74) *Attorney, Agent, or Firm* — James L. Clingan, Jr.; Mary Jo Bertani

(57) ABSTRACT

Another semiconductor device includes a first layer including a plurality of electrically conductive wires, a second layer, a plurality of non-functional via pads are included in the second layer or between the first layer and the second layer. A dangling via is included within a specified area of the first layer. The dangling vias connect one or more of the wires in the first layer to a respective one of the via pads.

13 Claims, 2 Drawing Sheets

VIAS BETWEEN CONDUCTIVE LAYERS TO IMPROVE RELIABILITY

BACKGROUND

1. Field

This disclosure relates generally to semiconductor processing, and more particularly, to vias between conductive layers

2. Related Art

Vias are used for providing electrical connection between two different conductive layers. With the number of transistors that are now present on integrated circuits, the number of vias can exceed a billion and there can be ten different conductive layers. Even if each via is highly reliable, there are so many vias that it is likely for there to be at least one via failure. This has lead to widespread use of redundant vias in which there are at least two vias for a given electrical connection between conductive layers so even if one via fails, there will still be an electrical connection through the other via. In most cases this can be achieved without increasing the area of the integrated circuit. There are via locations, however, where adding a redundant via would require increasing the area. In such a case there is a tradeoff between a risk of via failure and increasing the area. For the case where the decision is to risk via failure, it is important the vias with no redundant via be reliable.

Accordingly, it is desirable to provide a technique for improving the reliability of vias that do not include a redundant via.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a first via is formed between two conductive lines from two different conductive layers in which both of the two conductive lines are used for an operational function. In addition, a dangling via is formed between the two other conductive lines and is electrically isolated from the first via. Only one of the two other conductive lines is used for an operational function. This is better understood by reference to the following description and the drawings.

Figure 1:
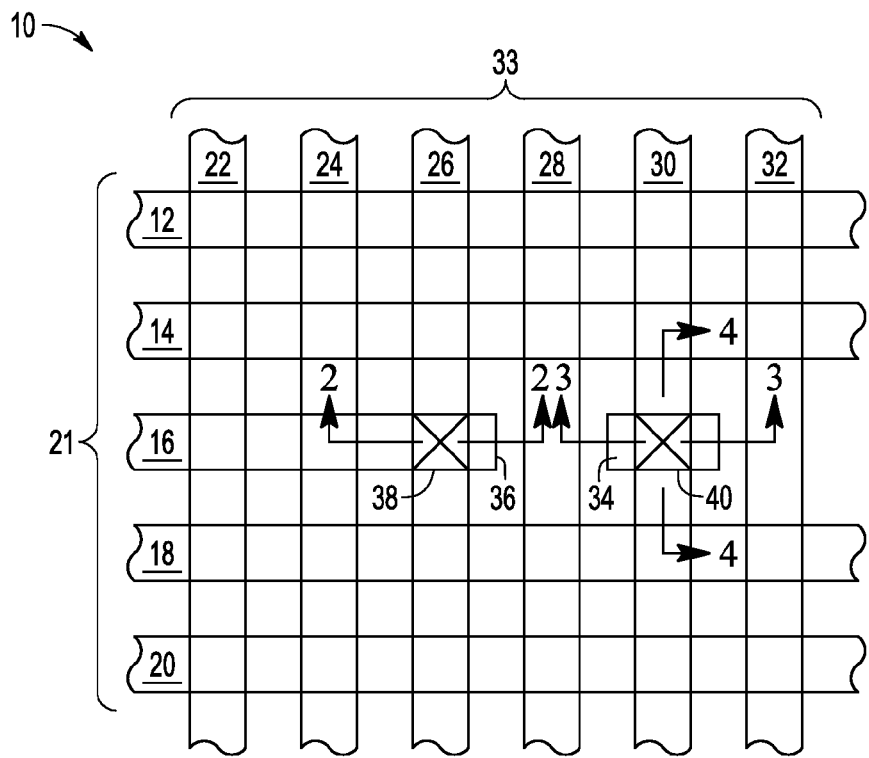
FIG. 1 is a top view of a portion of an integrated circuit showing a layout of a regular via and a dangling via according to an embodiment.

Shown in FIG. 1 is a layout 10 of a portion of an integrated circuit. Layout 10 includes conductive lines 12, 14, 16, 18, and 20 (12-20) forming a group 21 of conductive lines formed in a first conductive layer; conductive lines 22, 24, 26, 28, 30 (22-30) forming a group 33 of conductive lines formed in a second layer, a conductive line 34 formed in the first conductive layer; a via 38 connecting conductive line 16 to conductive line 26, and a via 40 connecting conductive line 30 to conductive line 34. Conductive lines may also be considered conductive wires. Conductive lines 12-20 of group 21 run in parallel and are relatively thin and relatively close together. Similarly, conductive lines 22-30, group 33, run in parallel, are relatively thin and relatively close together, and are orthogonal to the direction of conductive lines 12-20. It is common in an integrated circuit for a plurality of conductive lines to run in parallel and be at or near minimum pitch. Pitch is the distance between centers of lines adjacent to each other. The minimum pitch is for the case where the lines are as close together as allowable for a given process and lithography. When lines are at minimum pitch, it is not generally possible for there to be a via between them. The vias must be along the lines. This can be true even if the pitch is somewhat greater than minimum pitch. The pitch at which a redundant via may be reliably placed between the two adjacent lines may be called redundant via pitch. If the pitch is less than the redundant via pitch, then there is not sufficient space between adjacent lines for a redundant via. The pitch of the lines of group 21 and the pitch of the lines of group 33 are less than the redundant via pitch. A via between a portion of a first conductive layer and a portion of a second conductive layer in which one of the portions is not used for an operational function and the other portion is used for an operational function may be called a dangling via. An operational function, for example, may include coupling a digital signal, an analog signal, power, or ground between circuit elements such as between transistors or between transistors and a power supply terminal. Via 38 is a regular via in that it electrically couples conductive lines 26 and 16 and both conductive lines 26 and 16 are used in coupling an operational function between circuit elements. Via 40 is a dangling via in that conductive line 34 is electrically isolated except for being connected to via 40. The operational function is present at line 34 but does not pass through line 34 to another circuit element.

Conductive line 16 terminates at edge 36, and very near edge 36, via 38 couples conductive line 16 to conductive line 26. An operational function passes through both conductive line 16 and conductive line 26 and between circuit elements as the normal function of a via. In the arrangement shown, however, a redundant via cannot be formed because of the pitch of groups 21 and 33. Any via connecting to conductive line 16 will provide an undesired connection to a conductive line in the second conductive layer. Further, there are no other regular vias near via 38. Such a via is sometimes called a lonely via and actually is known to be less reliable than vias that are in close proximity to other vias. One of the theories for the reduced reliability of a lonely via is that it is more susceptible to problems of outgassing. If the opening in which the via is being formed is susceptible to outgassing problems, this problem may be alleviated by another via nearby that may not have the same susceptibility to outgassing or localized outgassing may be distributed so that no single via has to handle all of the outgassing.

Via 40 is added in close proximity to via 38 to help avoid or reduce the problems associated with a lonely via. Via 40, in this implementation, has conductive line 34 aligned with conductive line 16. Via 40, as a dangling via, is possible even though a redundant via is not. Via 40 is also possible even though the pitch of conductive lines 12-20 and 22-30 prevent a via between the lines even in a location where the via would not be a redundant via.

Figure 2:
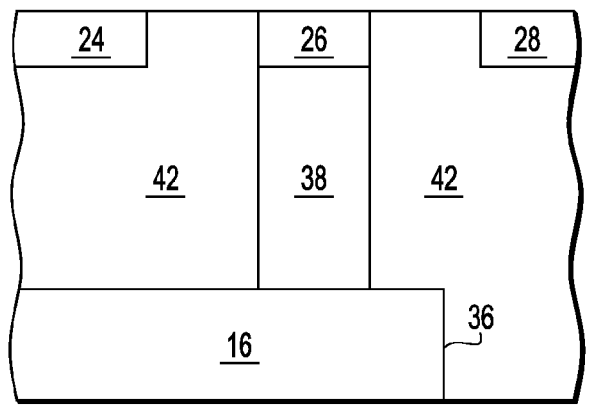
FIG. 2 is a cross section of the regular via of FIG. 1.

Shown in FIG. 2 is a cross section of via 38 on conductive line 16 as a lower conductive line terminating at edge 36, an interlayer dielectric 42 over conductive line 16, conductive line 24 on interlayer dielectric 42, and conductive line 26 on via 38. Via 38 would be a lonely via but for the presence of via 40. Interlayer dielectric 42 is preferably mostly oxide and may have an etch stop layer that may be a different material, such as nitride, useful in forming via 38. Via 38 may be formed using a dual damascene process common in forming vias. Conductive lines 16, 24, and 26 may be mostly copper with liners of a different material useful in forming the conductive lines reliably. Conductive lines 24 and 26 are formed at the same time and thus considered part of the same conductive layer. Many other conductive lines are also formed at the same time as conductive lines 24 and 26.

Figure 3:
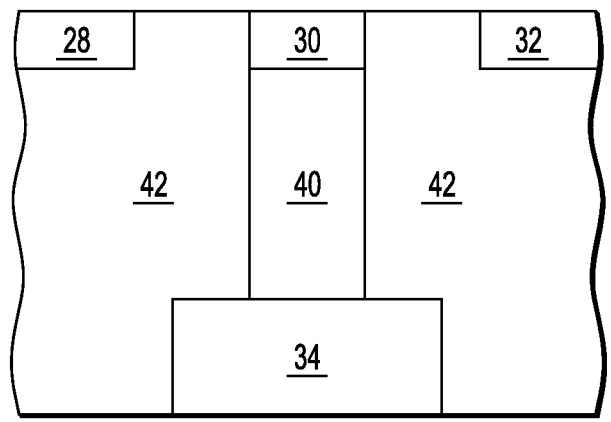
FIG. 3 is a first cross section of the dangling via of FIG. 1.

Shown in FIG. 3 is a cross section of via 40 along the same direction as the cross section of FIG. 2 of via 38. Via 40 is formed on conductive line 34 which is formed so as to be able to form via 40 but is not used for providing an operational function between circuit elements. Conductive line 30 is between conductive lines 28 and 32. Except for the connection to via 40, conductive line 34 is electrically isolated. Interlayer dielectric 42 is also over conductive line 34. Conductive line 30 is on via 40. Conductive lines 28 and 32 are on interlayer dielectric 42. Conductive lines 34 and 16 are formed at the same time and considered as different portions of the same conductive layer. Via 40 is formed in the same manner and at the same time as via 38 and may be mostly copper with conductive liners of a different conductive material as is common for vias.

Figure 4:
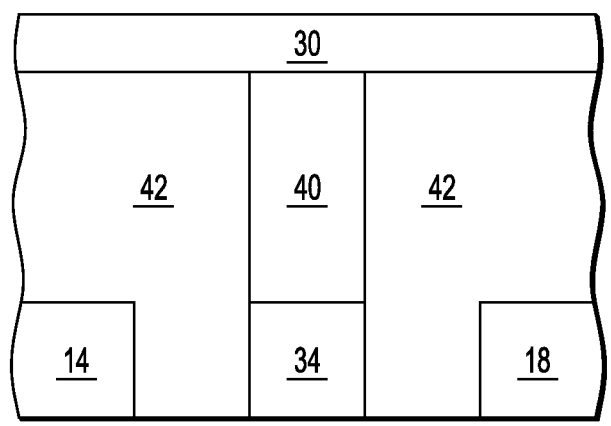
FIG. 4 is a second cross section of the dangling via of FIG. 1.

Shown in FIG. 4 is a cross section of via 40 orthogonal to the direction of the cross sections of FIGS. 2 and 3. Conductive line 30 runs across the entire cross section being on interlayer dielectric 42 except for a portion being on via 40. Interlayer dielectric 42 is on conductive lines 14 and 18. Via 40 is on conductive line 34.

Thus, a dangling via is formed to provide a companion via to via 38 that, but for the presence of via 40, would be a lonely via and thereby have the reliability issues associated with a lonely via. Although an additional via is provided, the additional via, via 40, does not require additional space on interlayer dielectric 42 because via 40 connects to an existing conductive line, conductive line 30, where there is a available space due to lonely via 38, by definition, not having other vias in close proximity.

By now it should be appreciated that there has been provided a semiconductor device including a first layer including a plurality of electrically conductive wires. The semiconductor device further includes a second layer including a plurality of electrically conductive wires. The semiconductor device further includes a non-conductive material between the first layer and the second layer. The semiconductor device further includes a first electrically conductive via through the non-conductive material connecting the first and second layers at an intersection of a first wire on the first layer and a first wire on the second layer. The semiconductor device further includes a second electrically conductive via coupled between a second wire on the second layer to a conductive member that is electrically isolated from wires in any other layer of the semiconductor device. The semiconductor device may have a further characterization by which the second electrically conductive via is the only via within a predetermined distance from the first via. The semiconductor device may have a further characterization by which the second electrically conductive via is between the first and second layers. The semiconductor device may have a further characterization by which the wires in the first and second layers are smaller than wires that conduct power and ground signals in the semiconductor device. The semiconductor device may have a further characterization by which the wires in the first layer are perpendicular to the wires in the second layer. The semiconductor device may have a further characterization by which the conductive member is at least 2 pitches long. The semiconductor device may have a further characterization by which the second electrically conductive via is the only via between the first and second layers within a predetermined distance from the first electrically conductive via. The semiconductor device may have a further characterization by which the conductive member is approximately as wide as wire on the second layer. The semiconductor device may have a further characterization by which the first electrically conductive via and the second electrically conductive via are electrically isolated from one another. The semiconductor device may have a further characterization by which pitch between the wires in the first layer is less than redundant via pitch.

Also disclosed is a semiconductor device including a first layer including a plurality of electrically conductive wires. The semiconductor device further includes a second layer including a plurality of electrically conductive wires. The semiconductor device further includes a non-conductive material between the first layer and the second layer. The semiconductor device further includes a first electrically conductive via through the non-conductive material connecting the first and second layers at an intersection of a first wire on the first layer and a first wire on the second layer. The semiconductor device further includes a second electrically conductive via coupled between a second wire on the second layer to a conductive member that is electrically isolated from wires in any other layer of the semiconductor device. The semiconductor device may have a further characterization by which the second electrically conductive via is a dangling via and is the only via within a specified area of the first electrically conductive via. The semiconductor device may have a further characterization by which the wires in the first layer are smaller than wires that conduct power and ground signals in the semiconductor device. The semiconductor device may have a further characterization by which via pads of the first and second electrically conductive vias are at least 2 pitches long. The semiconductor device may have a further characterization by which the dangling via is isolated from the first electrically conductive via. The semiconductor device may have a further characterization by which the dangling via included to add structural stability to the semiconductor device. The semiconductor device may have a further characterization by which the dangling via is included to achieve a predetermined via density.

Disclosed also is a method for making a semiconductor device including forming a first conductive layer including a plurality of signal wires. The method further includes adding a dielectric layer on top of the first layer. The method further includes forming a conductive pad on or within the dielectric layer in the vicinity of an isolated via, wherein the isolated via is coupled between a first wire in the first conductive layer and a first wire in a second conductive layer. The method further includes forming a dangling via between a second wire in the second layer and the conductive pad, wherein the conductive pad is separated from components in the device other than the dangling via. The method may have a further characterization by which the dangling via is the only via between the first and second conductive layers within a predetermined distance from the isolated via. The method may have a further characterization by which forming a plurality of conductive pads and the dangling via to achieve a specified via density between the first and second conductive layers.

Although the invention is described herein with reference to specific embodiments, various modifications and changes can be made without departing from the scope of the present invention as set forth in the claims below. For example, the structure was described as adding a conductive line under the dangling via, the described approach is also applicable to the situation in which the added conductive line over the dangling via. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a first layer including a plurality of electrically conductive wires;
    a second layer including a plurality of electrically conductive wires;
    a non-conductive material between the first layer and the second layer;
    a first electrically conductive via through the non-conductive material connecting the first and second layers at an intersection of a first wire on the first layer and a first wire on the second layer at a location where a redundant via is not possible; and
    a second electrically conductive via coupled between a second wire on the second layer to a conductive member that is electrically isolated from wires in any other layer of the semiconductor device and sufficiently close to the first electrically conductive via to provide protection to the first electrically conductive via from outgassing problems;
    wherein the wires in the first and second layers are smaller than wires that conduct power and ground signals in the semiconductor device.

2. The semiconductor device of claim 1, wherein the second electrically conductive via is the only via within a predetermined distance from the first via.

3. The semiconductor device of claim 1, wherein the second electrically conductive via is between the first and second layers.

4. The semiconductor device of claim 1, wherein the wires in the first layer are perpendicular to the wires in the second layer.

5. The semiconductor device of claim 1, wherein the conductive member is at least 2 pitches long.

6. The semiconductor device of claim 1, wherein the second electrically conductive via is the only via between the first and second layers within a predetermined distance from the first electrically conductive via.

7. The semiconductor device of claim 1, wherein the conductive member is approximately as wide as wire on the second layer.

8. The semiconductor device of claim 1, wherein the first electrically conductive via and the second electrically conductive via are electrically isolated from one another.

9. A semiconductor device, comprising:
    a first layer including a plurality of electrically conductive wires;
    a second layer including a plurality of electrically conductive wires;
    a non-conductive material between the first layer and the second layer;
    a first electrically conductive via through the non-conductive material connecting the first and second layers at an intersection of a first wire on the first layer and a first wire on the second layer and where no redundant via is possible; and
    a second electrically conductive via coupled between a second wire on the second layer to a conductive member that is electrically isolated from wires in any other layer of the semiconductor device and is in sufficiently close proximity to the first electrically conductive via to provide protection to the first electrically conductive via from outgassing problems;
    wherein pitch between the wires in the first layer is less than a pitch at which a redundant via may be reliably placed between two adjacent wires in the first layer.

10. A semiconductor device comprising:
    a first layer including a plurality of electrically conductive wires;
    a second layer including a plurality of electrically conductive wires;
    a non-conductive material between the first layer and the second layer;
    a first electrically conductive via through the non-conductive material connecting the first and second layers at an intersection of a first wire on the first layer and a first wire on the second layer, wherein the first electrically conductive via is in a location where no redundant via is possible; and
    a second electrically conductive via, which is a dangling via, coupled between a second wire on the second layer to a conductive member that is electrically isolated from wires in any other layer of the semiconductor device and sufficiently close to the first electrically conductive via to provide protection to the first electrically conductive via from outgassing problems;
    wherein the wires in the first layer are smaller than wires that conduct power and ground signals in the semiconductor device.

11. A method of making a semiconductor device comprising:
    forming a first conductive layer including a plurality of signal wires;
    adding a dielectric layer on top of the first layer;
    forming a second conductive layer over the dielectric layer including a plurality of signal wires;
    forming an isolated via, wherein the isolated via is coupled between a first wire of the first plurality of signal wires in the first conductive layer and a first wire of the plurality of signal wires in the second conductive layer in a location where a redundant via is not possible; and
    forming a dangling via between a second wire in the second layer and the conductive pad, wherein the conductive pad is separated from components in the device other than the dangling via and the dangling via is in sufficiently close proximity to the first electrically conductive via to provide protection to the first electrically conductive via from outgassing problems;

wherein the pluralities of signal wires of the first and second conductive layers are smaller than wires that conduct power and ground signals in the semiconductor device.

12. The method of claim 11, wherein the dangling via is the only via between the first and second conductive layers within a predetermined distance from the isolated via.

13. The method of claim 11, further comprising:
forming a plurality of conductive pads and the dangling via to achieve a specified via density between the first and second conductive layers.

* * * * *